US008976598B2

(12) United States Patent
Kim

(10) Patent No.: US 8,976,598 B2
(45) Date of Patent: Mar. 10, 2015

(54) SEMICONDUCTOR MEMORY DEVICE AND METHOD OF OPERATING THE SAME

(75) Inventor: Ki Seog Kim, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 379 days.

(21) Appl. No.: 12/982,590

(22) Filed: Dec. 30, 2010

(65) Prior Publication Data

US 2011/0261626 A1 Oct. 27, 2011

(30) Foreign Application Priority Data

Apr. 22, 2010 (KR) ........................ 10-2010-0037418

(51) Int. Cl.

| | |
|---|---|
| ***G11C 16/06*** | (2006.01) |
| ***G11C 11/56*** | (2006.01) |
| ***G11C 16/04*** | (2006.01) |
| ***G11C 16/26*** | (2006.01) |

(52) U.S. Cl.

CPC ........ *G11C 11/5642* (2013.01); *G11C 16/0483* (2013.01); *G11C 16/26* (2013.01)

USPC .................. 365/185.22; 365/185.25; 365/148

(58) Field of Classification Search

None

See application file for complete search history.

(56) References Cited

U.S. PATENT DOCUMENTS

| | | | | |
|---|---|---|---|---|
| 6,031,777 | A * | 2/2000 | Chan et al. | 365/210.1 |
| 6,269,022 | B1 * | 7/2001 | Ra | 365/185.24 |
| 7,813,214 | B2 * | 10/2010 | Noichi | 365/233.1 |
| 2003/0169622 | A1 * | 9/2003 | Ooishi et al. | 365/185.21 |
| 2004/0264247 | A1 * | 12/2004 | Kim | 365/185.17 |
| 2007/0159891 | A1 * | 7/2007 | Tu et al. | 365/185.24 |

FOREIGN PATENT DOCUMENTS

| | | |
|---|---|---|
| KR | 100859258 | 9/2008 |
| KR | 1020090000319 | 1/2009 |

* cited by examiner

*Primary Examiner* — Hoai V Ho
*Assistant Examiner* — James G Norman
(74) *Attorney, Agent, or Firm* — IP & T Group LLP

(57) ABSTRACT

A semiconductor memory device includes a memory block comprising cell strings each of which includes a plurality of memory cells, a current measurement circuit measure a current flowing through a selected bit line coupled to a selected cell string when a data read operation or a program verification operation is performed, and a logic group configured to change a read voltage, a program verification voltage, or a pass voltage in response to the measured current.

17 Claims, 4 Drawing Sheets

SEMICONDUCTOR MEMORY DEVICE AND METHOD OF OPERATING THE SAME

CROSS-REFERENCE TO RELATED APPLICATION

Priority to Korean patent application number 10-2010-0037418 filed on Apr. 22, 2010, the entire disclosure of which is incorporated by reference herein, is claimed.

BACKGROUND

Exemplary embodiments relate to a semiconductor memory device and a method of operating the same.

A nonvolatile memory device among semiconductor memory devices has a characteristic that stored data are not lost even though the supply of power is stopped. A representative nonvolatile memory device includes a flash memory device. The flash memory device can be chiefly divided into a NOR flash memory device and a NAND flash memory device according to the structure of a memory cell array. The gate of the flash memory cell includes a tunnel insulating layer, a floating gate, a dielectric layer, and a control gate.

In the semiconductor memory device, e.g., the NAND flash memory device, a program operation and an erase operation may be performed through F-N tunneling. Electrons are accumulated in the floating gate by the program operation, and electrons accumulated in the floating gate are discharged to a substrate by the erase operation. Further, when a read operation is performed, a threshold voltage of the memory cell, shifted according to the amount of electrons accumulated in the floating gate, is detected, and data are read on the basis of a level of the detected threshold voltage.

Although the nonvolatile memory device has a characteristic that stored data are not lost even though the supply of power is stopped, different data from first stored data may be read if a long time elapses after a program operation. This is because electrons accumulated in the floating gate of the memory cell are discharged after a lapse of time. Accordingly, the threshold voltage of the memory cell may be lower than the initial programmed level. Such a characteristic of the memory cell is called a retention characteristic.

BRIEF SUMMARY

Exemplary embodiments relate to a semiconductor memory device and a method of operating the same, which are capable of preventing an error in read data by changing a read voltage or a pass voltage on the basis of the detection of a shift in the threshold voltage due to a lapse of time after data were programmed in a memory cell.

A semiconductor memory device according to an exemplary aspect of this disclosure includes a memory block comprising cell strings each of which includes a plurality of memory cells, a current measurement circuit configured to measure a current flowing through a selected bit line coupled to a selected cell string when a data read operation or a program verification operation is performed, and a logic group configured to change a read voltage, a program verification voltage, or a pass voltage in response to the measured current.

The current measurement circuit may include a current measurement unit for measuring the current flowing through the selected bit line and an Analog/Digital (A/D) converter for converting a magnitude of the current, measured by the current measurement unit, into digital information and outputting the digital information as the measured current.

The current measurement unit may be fixedly coupled to the selected bit line and may measure a magnitude of the current flowing through the selected bit line.

The logic group may include a control logic for changing the read voltage, the program verification voltage, or the pass voltage using voltage set information based on the measured current, and a register configured to store the voltage set information.

The control logic may decrease the read voltage, the verification voltage, or the pass voltage in proportion to the magnitude of the measured current according to the voltage set information.

Memory cells coupled to the selected bit line may be programmed to have the highest threshold voltage distribution among a plurality of threshold voltage distributions used to program the memory cells of the memory block.

A method of operating a semiconductor memory device which comprises cell strings and a plurality of word lines, the cell strings each comprising a plurality memory cell coupled to the respective word lines, according to another exemplary aspect of this disclosure includes precharging bit lines coupled to the respective cell strings in response to a read command or a program verification command, supplying a first read voltage or a first verification voltage to a word line selected according to the read command or the program verification command and supplying a pass voltage to the remaining word lines, measuring a magnitude of a current flowing through a first bit line which is one of the bit lines; setting the first read voltage or the first verification voltage based on the measured current, and reading or verifying data stored in a memory cell coupled to the selected word line using the set read voltage or the set verification voltage.

Setting the first read voltage or the first verification voltage may include comparing the measured current with a reference current, and setting the first read voltage or the first verification voltage to the set read voltage or the set verification voltage based on the comparison result.

If the current flowing through the first bit line is equal to or greater than the reference current, the setting of the first read voltage or the first verification voltage to the set read voltage or the set verification voltage includes changing the first read voltage or the first verification voltage to a second read voltage or a second verification voltage based on the comparison result, precharging the bit lines and supplying the second read voltage or the second verification voltage to the selected word line and the pass voltage to the remaining word lines, measuring the magnitude of the current flowing through the first bit line and comparing the measured current with the reference current, and setting the second read voltage or the second verification voltage as the set read voltage and the set verification voltage when the magnitude of the current flowing through the first bit line is smaller than the reference current by repeatedly performing steps of changing, precharging, and measuring.

A method of operating a semiconductor memory device which comprises cell strings and a plurality of word lines, the cell strings each comprising a plurality memory cell coupled to the respective word lines, according to yet another exemplary aspect of this disclosure includes precharging bit lines coupled to the respective cell strings in response to a read command or a program verification command, supplying a read voltage or a verification voltage to a word line selected according to the read command or the program verification command and supplying a first pass voltage to the remaining word lines, measuring a magnitude of a current flowing through a first bit line which is one of the bit lines setting the first pass voltage based on the measured current, and reading or verifying data stored in a memory cell coupled to the selected word line using the read voltage or verification voltage and the set pass voltage.

Setting the first pass voltage may include comparing the measured current with a reference current, and setting the first pass voltage to the set pass voltage based on the comparison result.

If the current flowing through the first bit line is equal to or greater than the reference voltage on the comparison result, setting the first pass voltage to the set pass voltage includes changing the first pass voltage to a second pass voltage based on the comparison result, precharging the bit lines and supplying the read voltage or the verification voltage to the selected word line and the second pass voltage to the remaining word lines, measuring the magnitude of the current flowing through the first bit line and comparing the measured current with the reference current, and setting the second pass voltage as the set pass voltage when the magnitude of the current flowing through the first bit line is smaller than the reference current.

DESCRIPTION OF EMBODIMENTS

Hereinafter, exemplary embodiments of this disclosure will be described in detail with reference to the accompanying drawings. The figures are provided to enable those of ordinary skill in the art to make and use the exemplary embodiments of the disclosure.

Figure 1:
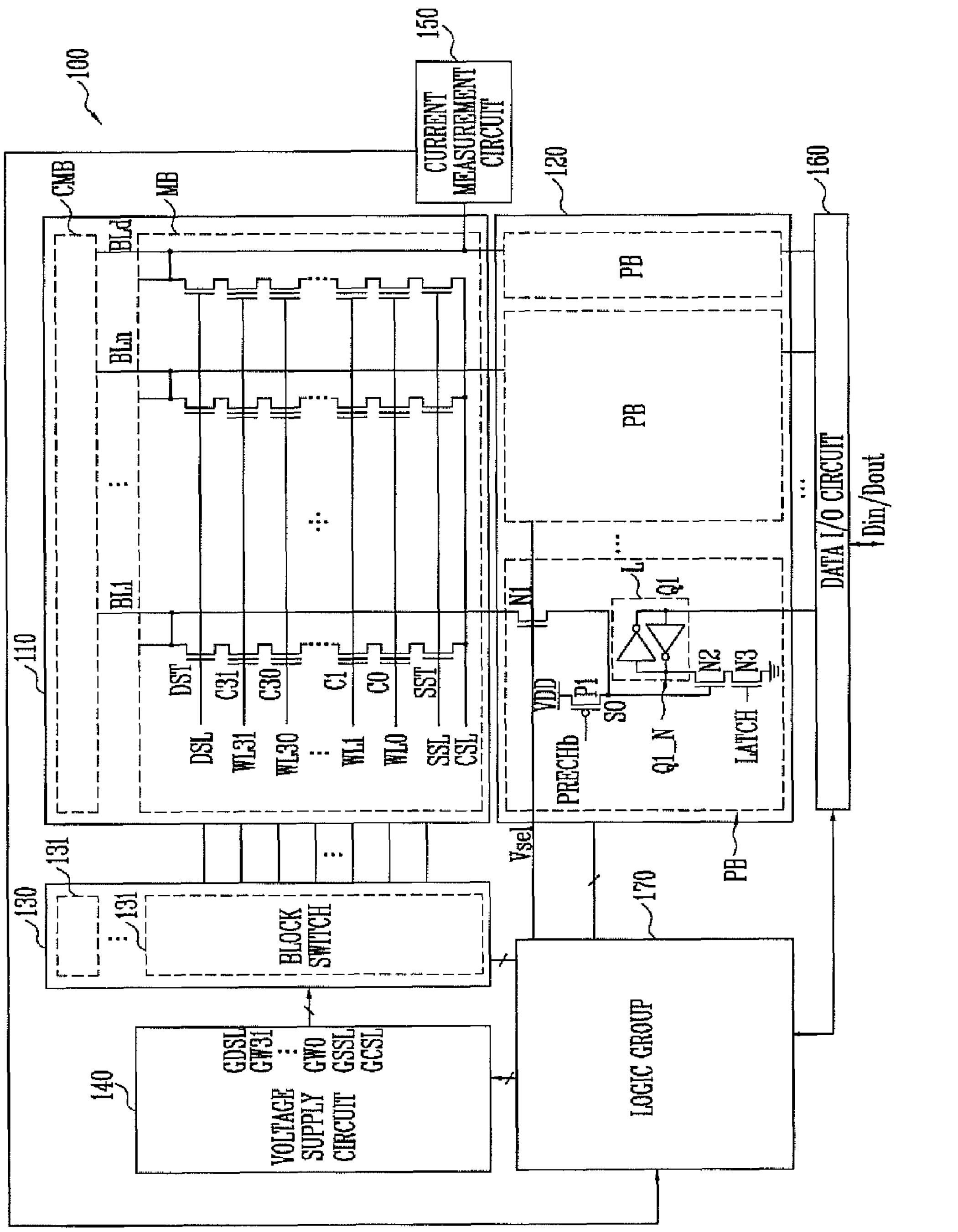
FIG. 1 is a diagram showing a semiconductor memory device according to an exemplary embodiment of this disclosure.

FIG. 1 is a diagram showing a semiconductor memory device according to an exemplary embodiment of this disclosure.

Referring to FIG. 1, the semiconductor memory device 100 according to the exemplary embodiment of this disclosure includes a memory cell array 110, a page buffer group 120, an X decoder 130, a voltage supply circuit 140, a current measurement circuit 150, a data I/O circuit 160, and a logic group 170.

The memory cell array 110 includes a plurality of memory blocks MB. Each of the memory blocks MB includes a plurality of cell strings. For convenience, one memory block is shown in detail in FIG. 1.

Each of the cell strings has a structure in which a drain selection transistor DST, a plurality of memory cells C0 to C31, and a source selection transistor SST are coupled in series. The number of memory cells coupled to the cell string can be freely changed.

The drains of the drain selection transistors DST are coupled to respective bit lines BL, and the sources of the source selection transistors SST are coupled to a common source line CSL.

In order to describe the operation of the semiconductor memory device according to the exemplary embodiment of this disclosure, one of the cell strings within the memory block MB is defined as a dummy cell string for measuring a bit line current and a bit line coupled to the dummy cell string is referred to as a dummy bit line BLd. Memory cells coupled to the dummy cell string (hereinafter referred to as 'dummy memory cells') have the same structure as the memory cells coupled to the other cell strings. Further, the dummy memory cells are programmed to have threshold voltages included in the highest threshold voltage distribution.

The gates of the drain selection transistors DST included in the respective cell strings are commonly coupled to a drain selection line DSL. Further, the gates of the source selection transistors SST included in the respective cell strings are commonly coupled a source selection line SSL.

The gates of the memory cells C0 to C31 of each cell string are commonly coupled to $0^{th}$ to thirty-first word lines WL0 to WL31, respectively.

Meanwhile, some of the memory blocks MB of the memory cell array 110 can be designated as CAM blocks CMB and used to store option information desirable for the operation of the semiconductor memory device 100. Voltage set information about a read voltage Vread or a verification voltage Vverify, changed according to the magnitude of a cell current in order to control the cell current, may also be included in the option information. Furthermore, where a pass voltage Vpass is changed in order to control a cell current, voltage set information about the pass voltage Vpass, changed according to the cell current, may be stored as the option information.

The cell current refers to current which flows through a selected memory cell when a read or verification operation is performed.

Here, the read operation and the verification operation of the semiconductor memory device 100 are similar to each other. The read voltage Vread can be controlled when the read operation is performed, and the verification voltage Vverify can be controlled when the verification operation is performed. In the following description. Because the read operation and the verification operation are similar, only the read operation is described below.

The page buffer group 120 may include a plurality of page buffers PB. The page buffers PB are coupled to respective bit lines BL1 to BLn.

In FIG. 1, the structure of the page buffer PB coupled to the bit line BL1 is shown in detail. The page buffer PB includes a first NMOS transistor N1 for coupling the bit line BL1 and a sense node SO together in response to a bit line selection signal Vsel and a first PMOS transistor P1 for precharging the sense node SO in response to a precharge signal PRECHb. The first NMOS transistor N1 is coupled between the bit line BL1 and the sense node SO. The first PMOS transistor P1 is coupled between the sense node SO and an input terminal to which a power supply voltage VDD is supplied.

The page buffer PB further includes a second NMOS transistor N2 operated in response to a potential of the sense node SO and a third NMOS transistor N3 operated in response to a latch signal LATCH.

The second NMOS transistor N2 and the third NMOS transistor N3 are coupled in series between a node Q1_N and a ground node.

A latch L coupled between the node Q1_N and a node Q1 is further provided. The latch L consists of two inverters.

The node Q1 is coupled to the data I/O circuit 160.

The page buffer PB of FIG. 1 illustrates one exemplary embodiment of the page buffer PB, although other embodiments may be utilized. For example, in order to increase the operation speed, two or more latches may be included in the page buffer PB.

The data I/O circuit 160 sequentially outputs data stored in the latch L of the page buffer PB or transfers externally inputted data to the latch L.

The X decoder 130 includes block switches 131 coupled to the respective memory blocks MB.

Each of the block switches 131 enables a corresponding memory block MB in response to a control signal generated by the logic group 170. Further, the block switch 131 couples the drain selection line DSL, the $0^{th}$ to thirty-first word lines WL0 to WL31, and the source selection line SSL of an enabled memory block to a global drain selection line GDSL, $0^{th}$ to thirty-first global word lines GWL0 to GWL31, and a global source selection line GSSL, respectively.

Operating voltages generated by the voltage supply circuit 140 are supplied to the global drain selection line GDSL, the $0^{th}$ to thirty-first global word lines GWL0 to GWL31, and the global source selection line GSSL.

The voltage supply circuit 140, responding to a control signal generated by the logic group 170, generates operating voltages when data are programmed into memory cells, data that are stored in memory cells are read, or the memory block is erased. More particularly, the voltage supply circuit 140 generates a plurality of the operating voltages (e.g., Vpgm, Vpass, Vverify, Vread, Vgnd, Vdsl, Vssl, and Vwell) and outputs them to the global drain selection line GDSL, the $0^{th}$ to thirty-first global word lines GWL0 to GWL31, and the global source selection lines GSSL.

The current measurement circuit 150 measures current flowing through the dummy bit line BLd and outputs the measured result as current magnitude information. The current magnitude information is inputted to the logic group 170.

The logic group 170 outputs voltage control information according to an operation command. The voltage control information output by the logic group 170 is inputted to the voltage supply circuit 140.

The voltage supply circuit 140 generates an operating voltage having a voltage level according to the voltage control information.

The logic group 170 outputs control signals for controlling the operations of the X decoder 130, the page buffer group 120, the current measurement circuit 150, and the data I/O circuit 160.

Furthermore, the logic group 170 changes a voltage level of the read voltage Vread for reading data according to the current magnitude information provided by the current measurement circuit 150. The logic group 170 is described in more detail below.

Meanwhile, the current measurement circuit 150 includes circuits having the following functions.

Figure 2:
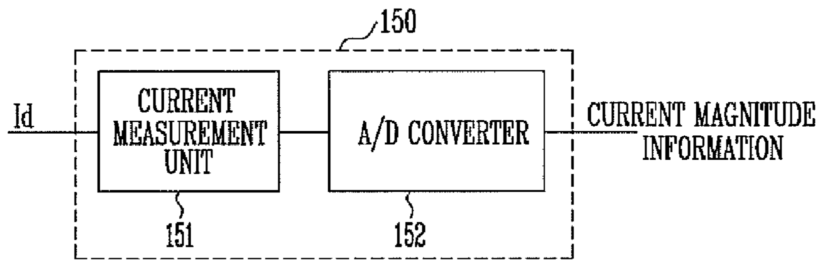
FIG. 2 is a diagram showing a current measurement circuit of FIG. 1.

FIG. 2 is a diagram showing the current measurement circuit 150 of FIG. 1.

Referring to FIG. 2, the current measurement circuit 150 includes a current measurement unit 151 and an Analog/Digital (A/D) converter 152.

The current measurement unit 151 measures a current Id flowing through the dummy bit line BLd and outputs a result of the measurement to the A/D converter 152. The A/D converter 152 converts the value of the current Id, flowing through the dummy bit line BLd, into digital information and outputs the digital information as the current magnitude information. The current magnitude information is inputted to the logic group 170.

The current measurement circuit 150 shown in FIG. 2 is only one exemplary embodiment. In other embodiments, the current measurement circuit 150 may include various elements other than the above circuits.

The logic group 170 for changing a voltage level of the read voltage Vread according to the current magnitude information is described below in more detail.

Figure 3:
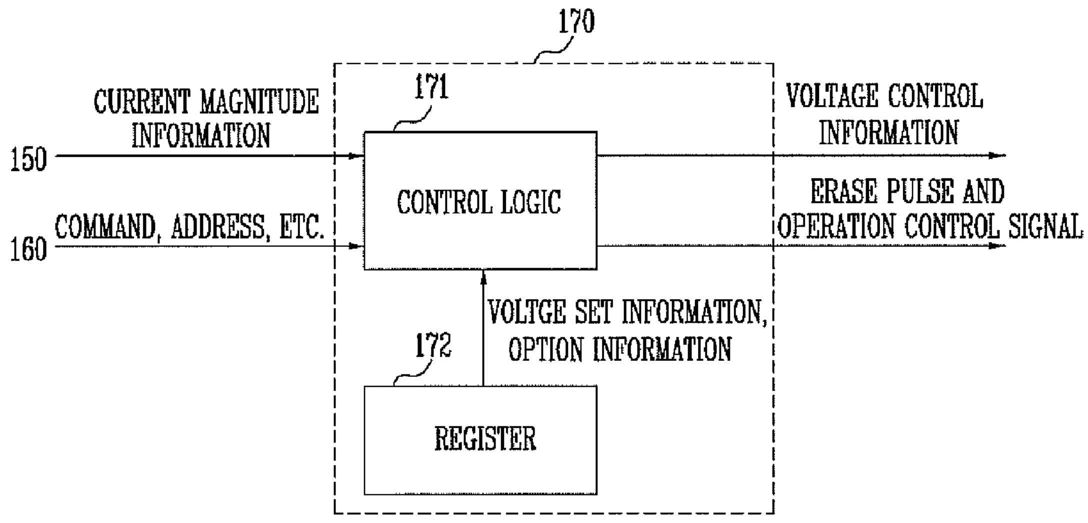
FIG. 3 is a diagram showing a logic group of FIG. 1.

FIG. 3 is a diagram showing the logic group 170 of FIG. 1.

Referring to FIG. 3, the logic group 170 includes a control logic 171 and a register 172.

The control logic 171 generates a control signal for controlling the program, read, or erase operation of the semiconductor memory device 100 in response to a command, address information, etc. from the data I/O circuit 160.

The command, the address information, etc. are inputted from the outside to the data I/O circuit 160. Further, the I/O circuit 160 transfers the external command, address information, etc. to the control logic 170.

Various pieces of option information necessary to control the program, read, or erase operation are stored in the register 172. Furthermore, the voltage set information about how a voltage level of the read voltage Vread is to be changed according to a current magnitude is stored in the register 142. In a case where a voltage level of the pass voltage Vpass is changed according to the current magnitude, the voltage set information indicating the voltage level of the pass voltage Vpass is stored in the register 142. The option information and the voltage set information may be programmed in the CAM block CMB. When power starts to be supplied to the semiconductor memory device 100, the control logic 171 reads the option information and the voltage set information stored in the CAM block CMB and stores them in the register 172.

Meanwhile, the control logic 171 outputs the voltage control information according to an operation of the semiconductor memory device 100. The control logic 171 outputs the voltage control information using the voltage set information stored in the register 172 and the current magnitude information received from the current measurement circuit 150. The voltage supply circuit 140 changes a voltage level of the read voltage Vread or the pass voltage Vpass on the basis of the voltage control information and outputs a changed voltage level.

That is, when the current magnitude information is received, the control logic 171 determines whether a present current magnitude included in the received current magnitude information is identical with a reference current Itrip.

If, as a result of the determination, the present current magnitude differs from the reference current Itrip, the control logic 171 determines a voltage level of the read voltage Vread or the pass voltage Vpass with reference to the voltage set information. The control logic 171 outputs the voltage control information according to the determined voltage level of the read voltage Vread or the pass voltage Vpass.

A process of changing a voltage level of the read voltage Vread according to a present current magnitude is described in more detail below.

In general, in semiconductor memory devices, a data read operation is performed like a program verification operation. Accordingly, the following read operation can also be applied to the program verification operation. In order to read data stored in memory cells, first, all bit lines are precharged.

Next, the read voltage Vread is supplied to a selected word line and the pass voltage Vpass is supplied to the remaining word lines.

If the memory cell coupled to the selected word line has not been programmed, the memory cell is turned on. Here, the degree of the turn-on of the memory cell varies according to a voltage difference between the read voltage Vread and a threshold voltage of the corresponding memory cell.

Meanwhile, if a threshold voltage of a memory cell coupled to the selected word line is higher than the read voltage Vread, the corresponding memory cell is turned off. Accordingly, current does not flow through a corresponding cell string, and the voltage precharged in a corresponding bit line remains intact.

For example, assuming that there is a memory cell having a threshold voltage higher than the read voltage Vread, when the read voltage Vread is supplied to the gate of a selected memory cell (to which a selected word line is coupled), the selected memory cell is turned off, and thus, current does not flow through a corresponding bit line.

However, if a long period of time elapses after the selected memory cell was programmed, the threshold voltage of the selected memory cell may be lowered in accordance with its retention characteristic.

In this case, the selected memory cell may be turned on for the same read voltage Vread. If the threshold voltage of the selected memory cell is excessively lowered, the voltage of the bit line may be entirely discharged during an evaluation time.

Accordingly, a corresponding page buffer determines that the threshold voltage of the selected memory cell is lower than the read voltage Vread.

That is, when the selected memory cell was initially programmed, the threshold voltage of the selected memory cell was higher than the read voltage Vread. However, when data stored in the selected memory cell are read, the threshold voltage of the selected memory cell is read as being lower than the read voltage Vread.

In this case, the cell current Id flowing through a corresponding cell string of the selected memory cell has become equal to or higher than the reference current Itrip, which indicates a current that can discharge the entire voltage precharged in the bit line during an evaluation time.

In order to compensate for the retention characteristic of the memory cell, the current measurement circuit 150 according to an exemplary embodiment of this disclosure measures the cell current Id flowing through the dummy bit line BLd and provides the current magnitude information according to a result of the measurement.

Further, the control logic 171 controls the cell current Id so that it is lower than the reference current Itrip. More specifically, the control logic 171 controls the cell current Id by lowering the read voltage Vread according to the current magnitude information provided by the current measurement circuit 150.

As described above, dummy memory cells coupled to the dummy bit line BLd are programmed so that threshold voltages thereof are included in the highest threshold voltage distribution. Further, dummy memory cells are linearly subject to the influence of the retention characteristic which affects the $0^{th}$ to thirty-first memory cells within the same memory block MB.

The reason why the dummy memory cells are programmed so that threshold voltages thereof are included in the highest threshold voltage distribution is that they are more influenced by the retention characteristic with a rise in the threshold voltage of the memory cell. For this reason, in order to compensate for the influence of the retention characteristic to the highest degree, the dummy memory cells are programmed, so that they are influenced the greatest.

Figure 4:
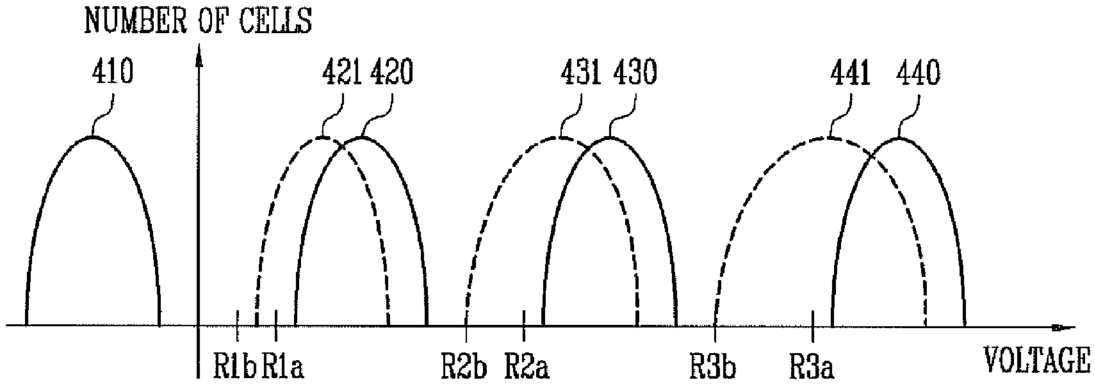
FIG. 4 is a diagram showing threshold voltage distributions when memory cells of FIG. 1 are programmed and a shift of the threshold voltage distributions occurs due to a retention characteristic of the memory cells.

FIG. 4 is a diagram showing threshold voltage distributions when the memory cells of FIG. 1 are programmed and a shift of the threshold voltage distributions due to the retention characteristic.

Referring to FIG. 4, the memory cells of FIG. 1 have first to fourth threshold voltage distributions 410 to 440 as a result of a first program operation. First to third read voltages R1*a*, R2*a*, and R3*a* are used as read voltages for reading data stored in the memory cells when they are initially programmed.

The threshold voltages of the memory cells may be lowered after a lapse of time. Thus, the memory cells once having second, third, and fourth threshold voltage distributions 420, 430, and 440 may have fifth, sixth, and seventh threshold voltage distributions 421, 431, and 441, respectively.

When the threshold voltage distributions of the memory cells are shifted to the fifth to seventh threshold voltage distributions 421, 431, and 441, if data stored in the memory cells are read using the first to third read voltages R1*a*, R2*a*, and R3*a*, erroneous data may be read.

Accordingly, in an exemplary embodiment of this disclosure, the degree of influence of the retention characteristic is determined using dummy memory cells and a read voltage is changed so that normal data are read.

Figure 5:
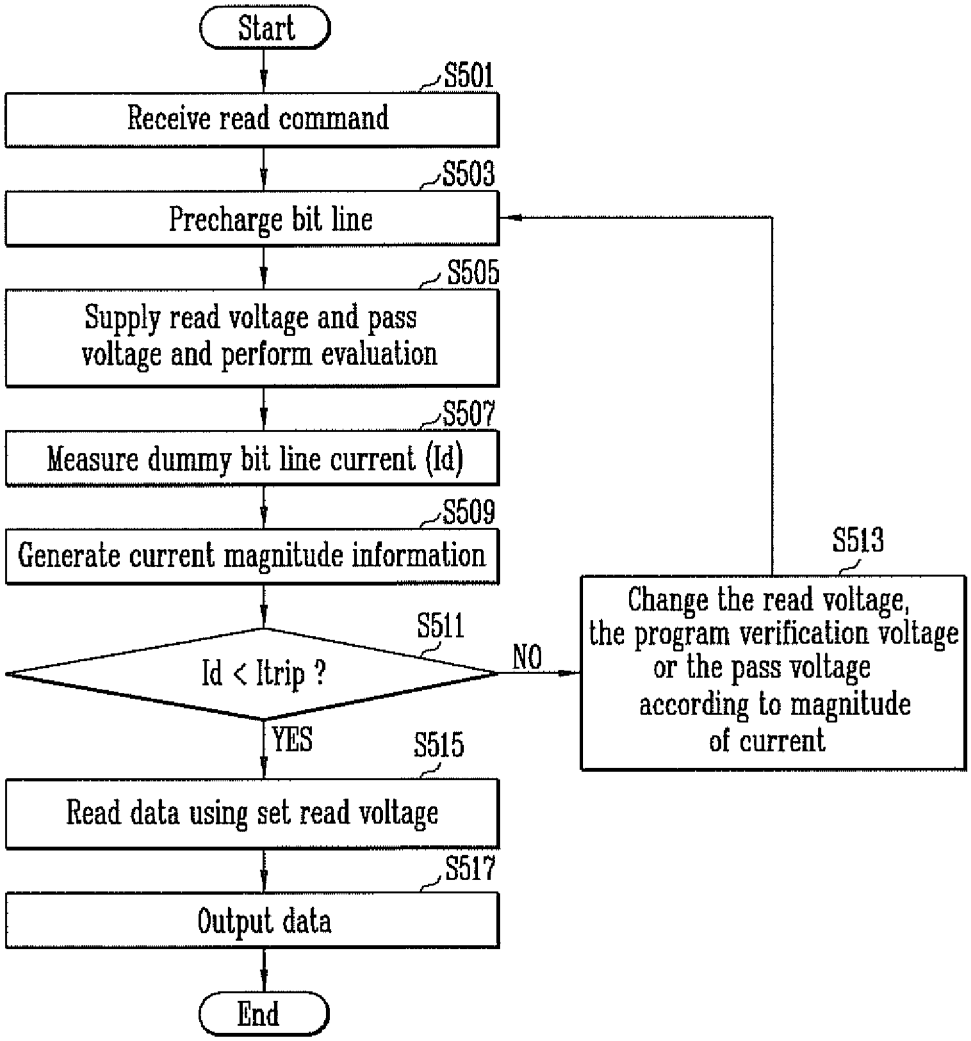
FIG. 5 is a flowchart illustrating a data read operation according to an exemplary embodiment of this disclosure.

FIG. 5 is a flowchart illustrating a data read operation according to an exemplary embodiment of this disclosure.

The flowchart of FIG. 5 is described with reference to FIGS. 1 to 4.

When a data read command is received at step S501, the control logic 171 of the logic group 170 precharges all the bit lines at step S503.

Next, the third read voltage R3*a* having the highest voltage level is supplied to a selected word line, and a pass voltage Vpass is supplied to the remaining word lines. In this state, an evaluation process is performed to change a precharged voltage of the bit line at step S505.

During the evaluation process, the current measurement circuit 150 measures the magnitude of a current Id flowing through the dummy bit line BLd at step S507, and generates and outputs current magnitude information at step S509.

The current magnitude information is inputted to the control logic 171.

As described above, when the selected memory cells were programmed, the dummy memory cells were programmed to have the fourth threshold voltage distribution 440.

Accordingly, if the dummy memory cells have not been influenced by the retention characteristic, they are turned off in response to the third read voltage R3*a*. That is, the current Id flowing through the dummy bit line BLd is lower than the reference current Itrip.

The control logic 171 checks whether a present current Id flowing through the dummy bit line BLd is lower than the reference current Itrip on the basis of current magnitude information output by the current measurement circuit 150 at step S511.

If, as a result of the check, the present current Id flowing through the dummy bit line BLd is lower than the reference current Itrip, the control logic 171 determines that corresponding dummy memory cells have not been influenced by the retention characteristic and reads data stored in memory cells other than the dummy memory cells at step S515. The read data are externally outputted at step S517.

However, if, as a result of the check at step S511, the present current Id flowing through the dummy bit line BLd is equal to or higher than the reference current Itrip, the control logic 171 changes the read voltage at step S513.

That is, if the dummy memory cells have been significantly influenced by the retention characteristic (i.e., the threshold voltages of the dummy memory cells have been lowered so that they are less than the third read voltage R3*a*), the current Id flowing through the dummy bit line BLd becomes equal to or higher than the reference current Itrip. Accordingly, the control logic 171 changes the third read voltage R3*a* to a sixth read voltage R3*b*.

To this end, the control logic 171 outputs changed voltage control information reflecting the adjusted read voltage. The voltage supply circuit 140 generates the sixth read voltage R3*b* on the basis of the changed voltage control information.

After changing the read voltage, the control logic 171 controls the operation of the semiconductor memory device 100 so that the steps S503 to S509 are performed again.

Further, if the current Id of the dummy bit line BLd is lower than the reference current Itrip, the control logic 171 may change the first and second read voltages R1*a* and R2*a* to fourth and fifth read voltages R1*b* and R2*b*, respectively. This change may be performed at about the same time that the third read voltage R3*a* is changed to the sixth read voltage R3*b*, at step S513. Thus, read voltages for subsequently reading data stored in other memory cells may also be changed.

Next, the control logic 171 reads data stored in the memory cells coupled to the selected word line using set read voltages, which may be the unchanged read voltages (i.e., the first to third read voltages R*a*1, R*a*2, and R*a*3), or the changed read voltages (i.e., the fourth to sixth read voltages R1*b*, R2*b*, and R3*b*) at step S515. Then, after reading the data, the control logic 171 externally outputs the read data at step S517.

If a second measured current flowing through the dummy bit line is equal to or higher than the reference current Itrip, the control logic 171 can perform a process of lowering the read voltages and measuring the current of the dummy bit line. Here, the current of the dummy bit line may be measured a number of times. Further, although not shown, the number of times that the current of the dummy bit line is repeatedly measured may be limited to a certain number of times.

Furthermore, when the read voltages are changed, the control logic 171 uses current magnitude information provided by the current measurement circuit 150 and voltage set information stored in the register 172.

If data are read as described above, current flowing through the dummy bit line BLd remains lower than the reference current Itrip.

Accordingly, threshold voltages of memory cells which are actually in a program state can be prevented from being erroneously read as being in an erase state because they are lowered by the influence of the retention characteristic. Furthermore, memory cells may be programmed in such a way as to minimize the influence of the retention characteristic by performing a program verification operation using the same method as the above read operation.

Furthermore, although the read voltage Vread is changed in FIG. 5, the current Id of the dummy bit line may be used to change the pass voltage Vpass.

In a semiconductor memory device and a method of operating the same according to exemplary embodiments of this disclosure, a shift in the threshold voltage of memory cells is detected by taking a retention characteristic of the memory cells into consideration, and a read voltage or a pass voltage is changed on the basis of a change in the detected characteristic of the memory cell. Accordingly, reliability of read data can be improved.

What is claimed is:

1. A semiconductor memory device, comprising:

a memory block comprising cell strings each of which includes a plurality of memory cells coupled to word lines;

a current measurement circuit configured to measure a current flowing through a selected bit line coupled to a cell string selected to perform a data read operation or a program verification operation; and a logic group configured to change a read voltage, a program verification voltage, or a pass voltage in response to the measured current when the current flowing through the selected bit line is lower than a reference current, wherein the changed read voltage or the changed program verification voltage is supplied to a selected word line and the changed pass voltage is supplied to remaining word lines to perform the data read operation or the program verification operation, when the current flowing the selected bit line is lower than the reference current.

2. The semiconductor memory device of claim 1, wherein the current measurement circuit comprises:

a current measurement unit configured to measure the current flowing through the selected bit line; and an Analog/Digital (A/D) converter configured to convert a magnitude of the current, measured by the current measurement unit, into digital information and output the digital information as the measured current.

3. The semiconductor memory device of claim 2, wherein the current measurement unit is fixedly coupled to the selected bit line and measures a magnitude of the current flowing through the selected bit line.

4. The semiconductor memory device of claim 1, wherein the logic group comprises:

a control logic configured to change the read voltage, the program verification voltage, or the pass voltage using voltage set information based on the measured current; and a register configured to store the voltage set information.

5. The semiconductor memory device of claim 4, wherein the control logic decreases the read voltage, the verification voltage, or the pass voltage in proportion to the magnitude of the measured current according to the voltage set information.

6. The semiconductor memory device of claim 1, wherein memory cells coupled to the selected bit line are programmed to have a highest threshold voltage distribution among a plurality of threshold voltage distributions used to program the memory cells of the memory block.

7. A method of operating a semiconductor memory device comprising cell strings and a plurality of word lines, the cell strings each comprising a plurality memory cells coupled to the respective word lines, the method comprising:

precharging bit lines coupled to the respective cell strings in response to a read command or a program verification command;

supplying a read voltage or a verification voltage to a word line selected according to the read command or the program verification command and supplying a pass voltage to remaining word lines;

measuring a magnitude of a current flowing through a first bit line which is one of the bit lines;

changing the read voltage, the pass voltage or the verification voltage based on the measured current if the measured current is lower than a reference current; and reading or verifying data stored in a memory cell coupled to the selected word line by supplying the changed read voltage or the changed verification voltage to the selected word line and the changed pass voltage is supplied to remaining word lines, if the measured current is lower than the reference current.

8. The method of claim 7, wherein the changing of the read voltage or the verification voltage comprises:

comparing the measured current with the reference current; and setting the read voltage or the verification voltage to the changed read voltage or the changed verification voltage based on the comparison result.

9. The method of claim 8, wherein, if the current flowing through the first bit line is equal to or greater than the reference current, the setting of the read voltage or the verification voltage to the changed read voltage or the changed verification voltage comprises:

changing the read voltage or the verification voltage to a changed read voltage or a changed verification voltage based on the comparison result;

precharging the bit lines and supplying the changed read voltage or the changed verification voltage to the selected word line and the pass voltage to the remaining word lines;

measuring the magnitude of the current flowing through the first bit line and comparing the measured current with the reference current; and setting the changed read voltage or the changed verification voltage to the secondary changed read voltage and the secondary changed verification voltage when the magnitude of the current flowing through the first bit line is smaller than the reference current.

10. The method of claim 9, wherein the precharging, supplying, and measuring are repeatedly performed a number of times.

11. The method of claim 10, wherein the number of times the precharging, supplying, and measuring are performed is limited to a predetermined number.

12. The method of claim 7, wherein a threshold voltage of memory cells belonging to a cell string coupled to the first bit line is programmed to have a highest threshold voltage distribution among a plurality of threshold distributions used to program the memory cells.

13. A method of operating a semiconductor memory device comprising cell strings and a plurality of word lines, the cell strings each comprising a plurality memory cell coupled to the respective word lines, the method comprising:

precharging bit lines coupled to the respective cell strings in response to a read command or a program verification command;

supplying a read voltage or a verification voltage to a word line selected according to the read command or the program verification command and supplying a first pass voltage to remaining word lines;

measuring a magnitude of a current flowing through a first bit line which is one of the bit lines;

setting the first pass voltage based on the measured current; and reading or verifying data stored in a memory cell coupled to the selected word line using the read voltage or verification voltage and the set pass voltage.

14. The method of claim 13, wherein the setting of the first pass voltage comprises:

comparing the measured current with a reference current; and setting the first pass voltage to the set pass voltage based on the comparison result.

15. The method of claim 14, wherein, if the current flowing through the first bit line is equal to or greater than the reference voltage on the comparison result, setting the first pass voltage to the set pass voltage comprises:

changing the first pass voltage to a second pass voltage based on the comparison result;

precharging the bit lines and supplying the read voltage or the verification voltage to the selected word line and the second pass voltage to the remaining word lines;

measuring the magnitude of the current flowing through the first bit line and comparing the measured current with the reference current; and setting the second pass voltage as the set pass voltage when the magnitude of the current flowing through the first bit line is smaller than the reference current.

16. The method of claim 15, wherein: the precharging and measuring are repeatedly performed a number of times.

17. The method of claim 13, wherein a threshold voltage of memory cells belonging to a cell string coupled to the first bit line is programmed to have a highest threshold voltage distribution among a plurality of threshold voltage distributions used to program the memory cells.

* * * * *